United States Patent [19]

Avins

[11] 4,300,039
[45] Nov. 10, 1981

[54] INCREMENTAL ENCODER
[75] Inventor: Jeremiah Y. Avins, Kendall Park, N.J.
[73] Assignee: RCA Corporation, New York, N.Y.
[21] Appl. No.: 93,230
[22] Filed: Nov. 13, 1979
[51] Int. Cl.³ ............................................. G06F 7/38
[52] U.S. Cl. .......................... 235/92 EV; 340/347 P
[58] Field of Search ............. 235/92 EV; 307/222 R; 328/44; 340/347 P, 347 CC

[56] References Cited
U.S. PATENT DOCUMENTS
3,786,492  1/1974  Carelton ....................... 340/347 CC OTHER PUBLICATIONS
Hancock, "Electronic Engineering", May 1978, p. 24.
Rao, "Electronics", Apr. 26, 1979, p. 118.

Primary Examiner—Charles D. Miller
Attorney, Agent, or Firm—Samuel Cohen; Robert L. Troike; Donald W. Phillion

[57] ABSTRACT

A circuit for detecting each level transition of a first two-level signal of a given frequency and its leading or lagging phase relationship with a second two-level signal of said given frequency, and comprising signal level storage means having a data input terminal for receiving said first signal, a first output terminal, and a first clock pulse input terminal, and constructed to store the signal level supplied to its data input terminal and to transfer said stored signal level to its output terminal when a clock pulse is supplied to the clock pulse input terminal. First and second voltage comparator means each have a first input terminal for receiving said first and second signals, respectively, a second input terminal connected to said first output terminal and each constructed to respond to equal or non-equal signal levels supplied to their first and second input terminals to produce first and second input signals, respectively. Also provided are means responsive to the output signal of said first and second voltage comparator means to determine the leading or lagging phase relationship of said first and second signals at each level transition of said first signal, and means for supplying a clock pulse to said first clock input terminal at a predetermined time after the occurrence of each level transition of said first signal.

10 Claims, 8 Drawing Figures

| BETWEEN TIMES $t_1-t_2$ IN FIG. 4. $\phi_1$ CHANGES FROM LOW TO HIGH | | | | NOTE |
|---|---|---|---|---|
| COLUMN 1 | COLUMN 2 | COLUMN 3 | COLUMN 4 | COLUMN 5 |
| POINT | CHANGE | $\phi_2$ STATUS | DIRECTION DETERMINING SIGNAL $e_{45}$ | |
| $e_{43}$ | ↑ | HIGH | HIGH | |
| $e_{46}$ | ↑ | " | " | |
| $e_{53}$ | ↑ | " | " | COUNT UP |
| $e_{44}$ | ↑ | " | " | |
| $e_{45}$ | ↓ | " | " | |
| $\phi_2$ CHANGES FROM HIGH TO LOW AT TIME $t_3$ IN FIG. 4, THEN BETWEEN TIMES $t_5-t_6$ $\phi_1$ CHANGES FROM HIGH TO LOW | | | | |
| $e_{43}$ | ↓ | LOW | HIGH | |
| $e_{46}$ | ↑ | " | " | |
| $e_{53}$ | ↑ | " | " | COUNT UP |
| $e_{44}$ | ↓ | " | " | |
| $e_{45}$ | ↓ | " | LOW | |
| THEN ROTATING WHEEL IN REVERSE DIRECTION BETWEEN TIMES $t_6-t_4$ | | | | |
| $e_{43}$ | ↑ | LOW | LOW | |
| $e_{46}$ | ↑ | " | " | |
| $e_{53}$ | ↑ | " | " | COUNT DOWN |
| $e_{44}$ | ↑ | " | " | |
| $e_{45}$ | ↑ | " | HIGH | |

A { (rows 1-5), B { (rows 6-10), C { (rows 11-15)

*Fig. 6.*

INCREMENTAL ENCODER

This invention relates generally to incremental encoders of the type employed to track the position of a moving object such as a bi-directionally rotatable disc and more particularly to a circuit for determining the phase relationship of a pair of two level signals of equal frequency produced by said moving object, upon the occurrence of each level transition of one of said signals.

There are many prior art structures which produce a pair of two-level signals whose phase relationship at the time of a level transition of one or either of the two level signals indicate a particular condition of the structure, such as the direction of rotation of a disc, producing the pair of two level signals. For example, many prior art shaft position tracking means employ a disc mounted on a shaft with a plurality of apertures arranged in a circular row around the edge of the disc. The apertures are spaced apart so that a light source directed therethrough to a photoelectric cell will produce a substantially squarewave signal. If two stationary light sources are directed through the circular row of apertures with a first light source being positioned in the center of an aperture at a given point in time when the second light source is just moving across the edge of an adjacent aperture into said adjacent area, a signal will be generated in each of two photoelectric cells, each of which receives the light from one of the light sources, with the phase of the first signal leading the phase of the second signal. If the direction of rotation of the disc is reversed then the phase of the first signal will lag the phase of the second signal. The second signal can be employed as a direction control signal with a first level thereof indicating direction of rotation of the disc in a first, clockwise direction, and with the second level thereof indicating direction of rotation of the disc in a second, counterclockwise direction.

Thus, when the disc is rotated in said first direction the positive-going leading edge of the first signal occurs when the second signal is at its first level, indicating an increment of rotation in said first direction of rotation. Then, if the rotation of the disc is reversed, what was formerly a negative-going edge of the first signal in the first direction of rotation now becomes a positive-going leading edge occurring during the second level of the second signal, thereby indicating a counterclockwise direction of rotation. It is apparent in these prior art devices that the position indicating level transitions (the positive-going transitions) of the first signal caused by the disc rotating in one direction do not occur at the same angular positions of the disc as the positive-going level transitions generated when the disc rotates in the opposite direction. Such non-coincidence of occurrence of positive-going level transitions during clockwise and counterclockwise rotation of the disc can result in a position indicating error. Further, if the position of the disc should be very near a level producing transition, oscillation of the disc can produce a series of level transitions of said first signal but with pulses occurring only when low-to-high level transitions occur. No counts occur when high-to-low level transitions occur. Thus the position of the disc appears to be changing continuously in one direction when in fact it is only oscillating about a particular level transition of said first signal.

Other prior art systems have been devised which detect the phase of the leading or lagging phase relationship of the two signals at the time of each level transition of one of the two signals, and without the errors resulting from the oscillations described above. These prior art devices accomplish their result by, in effect, dividing the two signals into four quadrants for each complete cycle of operation. More specifically, the logic levels of the two signals will have four permutative relationships, e.g. when they are both high, when they are both low, and when one is high and the other is low. Such prior art devices further contain logic which remembers at least the two immediately prior permutations of logic levels in addition to the one in which a determination of phase relationship of the two signals at a level transition is to be made. Such prior art devices are complex and require a relatively extensive amount of logic in order to remember the two prior level states as well as the one in which the decision is made, and then to decide from such information the proper interpretation of the level transition in the state being considered. Such complex logic is expensive and prohibitive in many applications. Further, because of the complexity, the time required for the logic to make a decision is larger than would be required for a system having fewer logic components, and therefore functions more slowly to further limit the feasible applications.

The present invention provides a simplified and inexpensive circuit that eliminates the aforementioned difficulties of prior art structures and in which both the positive-going and negative-going transitions of the first two-level signal produce pulses or counts at the time of the level transitions. Such pulses increment or decrement a counter in accordance with the direction the disc is rotating; such direction being determined by the level of the second two-level signal and the polarity of level transition of the first signal.

In accordance with a preferred form of the invention, there is provided a first signal level storage means having a data input terminal means, first output terminal means, and first clock input means and constructed to store a signal level supplied to said data input terminal means and to transfer said stored signal level to its output terminal means when a clock signal is supplied to its clock input means. Also provided is a first means for determining the phase relationship of said two signals at each level transition of said first signal and having a direction determining terminal and a second clock input means. First and second voltage comparator means each comprise first input terminal means for receiving, respectively, said first and second two-level input signals and second input terminal means connected to the output terminal means of the signal level storage means, and responsive to equal and non-equal signal levels supplied to its two input terminals to produce output signals of first and second levels, respectively. Said first and second voltage comparator means each further comprise output terminal means connected respectively to said second clock input means and to said count direction determining terminal of said first means. Other means are provided for supplying a clock pulse to said clock input means of said signal level storage means a predetermined time interval after the occurrence of each level transition of the said first two-level signal.

In the drawings:

FIG. 6 is a chart showing the changes in voltage levels at various points in the circuit of FIG. 3 when the disc is rotating in its first direction and also when it is rotating in the opposite direction;

Figure 1:
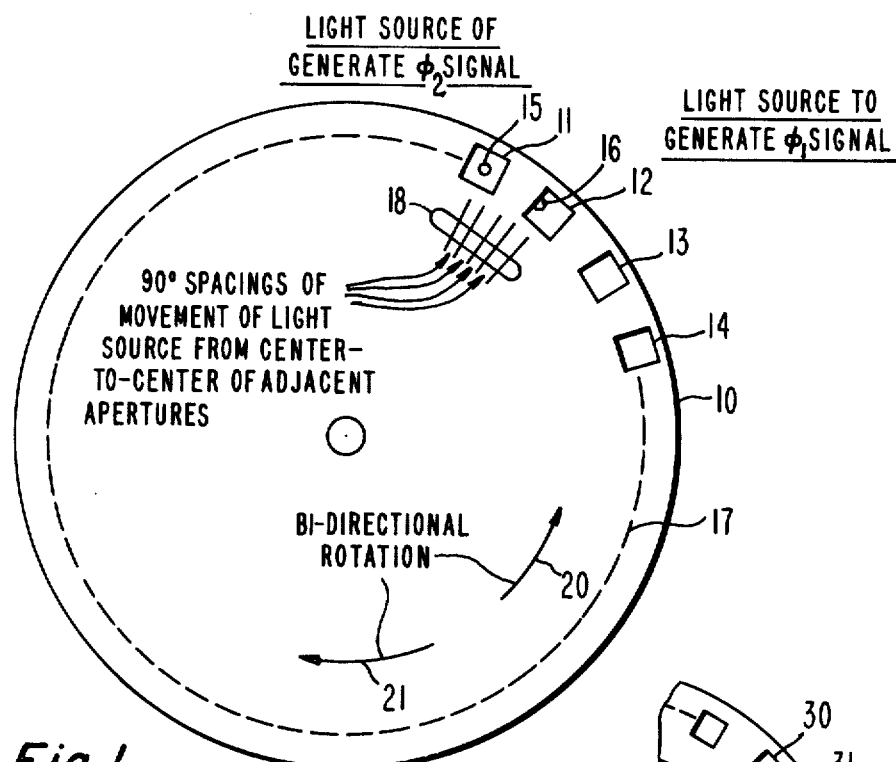
FIG. 1 shows a disc with apertures around the perimeter thereof for generating first and second direction indicating two-level signals with leading or lagging phase relationship.

Referring now to FIG. 1 there is shown prior art means for generating a pair of phase leading or lagging two-level signals. The disc 10 has a circular row of apertures 17 formed around the perimeter thereof such as the individual apertures 11, 12, 13 and 14. A pair of light sources 15 and 16 are positioned adjacent the holes to project a beam of light through the apertures to photo-electric devices (not shown but which could be photo-electric cells) as disc 10 is rotated. The two light sources 15 and 16 are positioned in such a manner that one of the light sources 15 will be centered in an aperture such as aperture 11 at the time that the other light source 16 is just crossing the edge of another aperture such as aperture 12. Thus, if the wheel is rotating in the counter-clockwise direction, as indicated by arrow 20, the signal $\phi_2$ produced by light source 15 will lead the phase of the signal $\phi_1$ produced by light source 16 to produce the signals $\phi_1$ and $\phi_2$ shown in waveforms A and B of FIG. 4.

Figure 4:
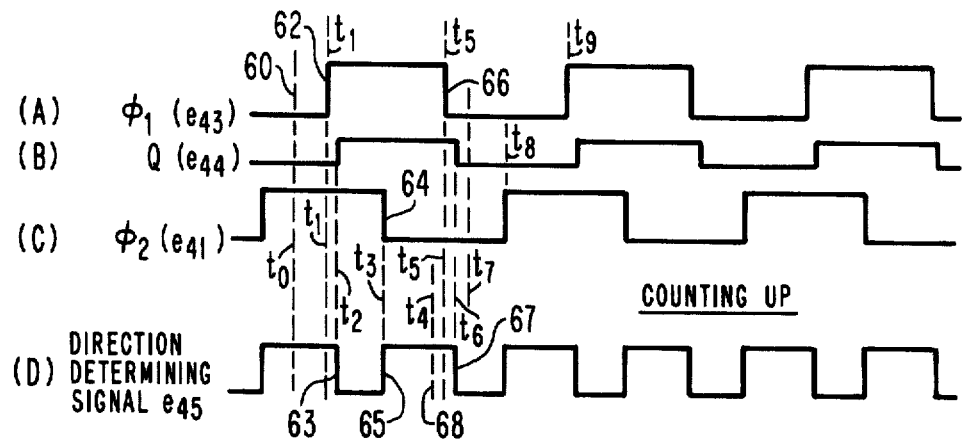
FIG. 4 is a set of waveforms showing the relationship of the two-level input signals and the direction indicating signal when the disc is rotating in a first direction.

Specifically, waveform A, designated as signal $\phi_1$, is generated by light source 16 of FIG. 1 and signal $\phi_2$ shown in waveform B of FIG. 4, is generated by light source 15 of FIG. 1. It is to be noted that while signals $\phi_1$ and $\phi_2$ are shown as being in phase quadrature it is not necessary that they be so. It is only necessary that there be a leading and lagging phase relationship.

Figure 5:
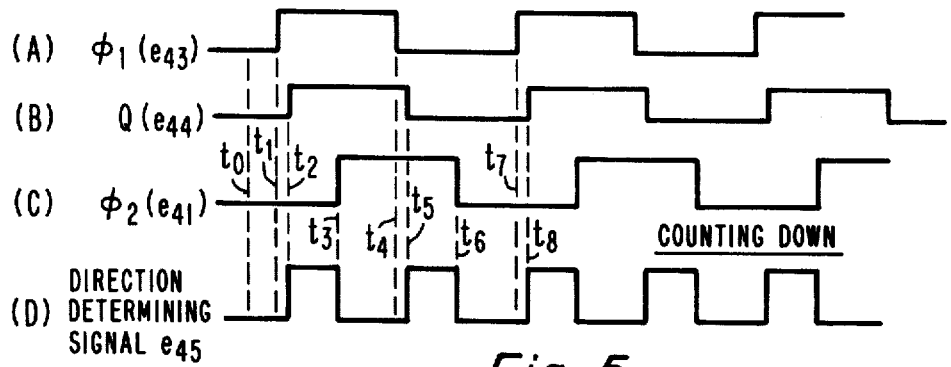
FIG. 5 is a set of waveforms similar to that of FIG. 4 showing the relationship between the two two-level input signals and the direction determining signal when the disc is rotating in the opposite direction.

When the rotation of disc 10 is reversed to rotate in the direction of arrow 21 (clockwise), the phase of the signal $\phi_1$ produced by light source 16 will lead the phase of the signal $\phi_2$ produced by light source 15, as shown in waveforms A and B of FIG. 5.

Figure 2:
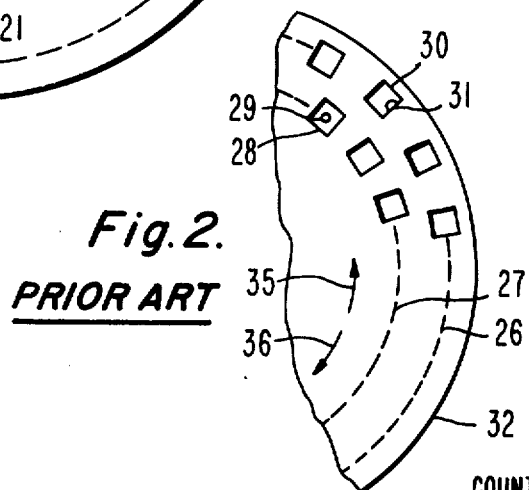
FIG. 2 shows another disc configuration for generating first and second two-level signals with leading or lagging phase relationship.

FIG. 2 shows another means for generating a pair of phase quadrature two-level signals. In FIG. 2 the disc 32 has two rows of apertures 26 and 27 formed near the perimeter thereof, each consisting of individual apertures such as apertures 28 and 30. The two light sources 29 and 31 are positioned adjacent the two rows 26 and 27, respectively, as shown in FIG. 2. When the disc 32 is rotating counterclockwise (in the direction of arrow 35) the signal $\phi_2$ produced by light source 29 and its associated photo-electric device (not shown) leads the phase of the signal $\phi_1$ produced by light source 31 and its associated photo-electric device to produce the signals $\phi_1$ and $\phi_2$ of waveforms A and B of FIG. 4. The signal produced by light source 31 corresponds to the signal $\phi_1$ of waveform A of FIG. 4.

If the rotation of disc 32 is reversed, to be as indicated by arrow 36 (the clockwise direction), then the signal $\phi_2$ produced by light source 29 will lag the signal $\phi_1$ produced by light source 31.

Figure 3:
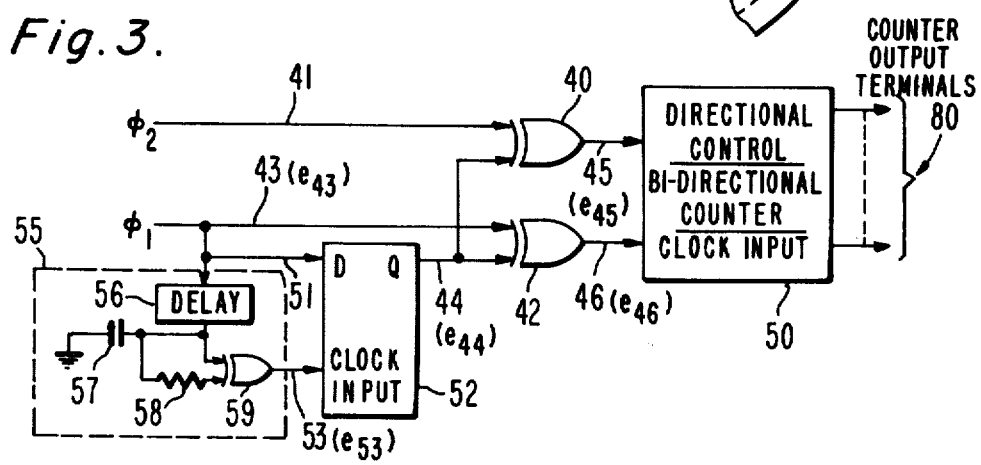
FIG. 3 is a combination block and logic diagram of one form of the invention.

Referring now to FIG. 3 the signal $\phi_1$ is supplied to one input of Exclusive OR gate 42, the output of which is supplied to the clock input terminal 46 of bi-directional counter 50. As will be explained below, each transition, whether positive-going or negative-going, of input signal $\phi_1$ will produce a positive pulse on the output of Exclusive OR gate 42 which in turn will cause the count of counter 50 to increment or decrement by one depending on whether $\phi_1$ leads or lags $\phi_2$ as discussed above. The phase relation of $\phi_1$ and $\phi_2$ depends upon the direction of rotation for the disc being monitored, as discussed above. The $\phi_1$ signal is also supplied to the D input 51 of conventional D-type flip-flop 52 which has the characteristic of storing the level of the signal supplied to its D input 51 but without changing the value of its Q output 44 until a clock pulse is supplied to the clock input terminal 53 thereof. Thus, if it is assumed that both the D input 51 and the Q output 44 of flip-flop 51 are at their low levels because of a prior high-to-low level transition of $\phi_1$, then a subsequent low-to-high level transition of $\phi_1$ will change the voltage level of the D input 51 but will not change the voltage level of the Q output 44. Accordingly, the signal levels supplied to the two inputs of Exclusive OR circuit 42 are different and a high level will be produced on its output 46 which will cause the bi-directional counter 50 to change its count by 1.

Similarly, if the D and Q terminals of flip-flop 52 are both assumed to be at a high level, due to a prior low-to-high level transition of input signal $\phi_1$, then the occurrence of a high-to-low level transition of $\phi_1$ will produce a low level on the D input 51. However, the Q output 44 will remain at a high level. Thus, the signals appearing on the two input leads of Exclusive OR gate 42 will again be different so that a positive output pulse appears on output terminal 46 thereof.

After each transition of $\phi_1$, whether from high-to-low or from low-to-high, the pulse generating circuit 55 will function to produce a delayed clock pulse to the clock input terminal 53. The pulse generating circuit 55 can include a delay means 56 to which the incoming signal $\phi_1$ is supplied. The output of delay means 56 is supplied in parallel through an RC time delay circuit comprised of resistor 58 and capacitor 57 to one input of Exclusive OR gate 59 and directly to the other input terminal thereof. Thus, for a short period of time after each level transition of $\phi_1$, one of the input terminals of Exclusive OR gate 59 will be at a high level and the other input terminal of OR gate 59 will be at a low level so that the output terminal 53 thereof will also be at a high level for said short period of time after each transition of signal $\phi_1$. The delay means 56 insures that the pulse supplied to clock input 53 of flip-flop 52 occurs after the counter 50 has registered the level change of $\phi_1$.

The level of input signal $\phi_2$, at the time of the transition of signal $\phi_1$, determines the direction of count of bi-directional counter 50 as will be seen more clearly from the discussion of waveforms A, B, C, and D of FIGS. 4 and 5 as set forth below.

Assume the initial conditions to be as represented at time $t_0$ in FIG. 4, at which time the level of $\phi_1$ is low and the level of $\phi_2$ is high. At time $t_1$ the level of $\phi_1$ changes from its low to its high level which will produce a sequence of voltage changes in the circuit of FIG. 3 between times $t_1$ and $t_2$ as shown in the upper half of the chart of FIG. 6. The chart of FIG. 6 consists of five columns. Column 1 defines the point on the circuit of FIG. 3 at which a voltage change occurs when $\phi_1$ goes to its high level. Thus, for example, $e_{43}$ of column 1 of FIG. 6 represents a positive-going change in the signal $\phi_1$ on the terminal 43 of FIG. 3.

Column 2 indicates the polarity of such change. Thus, point 43 is shown as going high by the upwardly pointing arrow in column 2. Column 3 shows the status of signal of $\phi_2$ as being high during times $t_1$-$t_2$ as can be seen from waveform B of FIG. 4. Column 4 shows the polarity of the direction determining signal $e_{45}$ appearing on lead 45 of FIG. 3, and FIG. 6 contains comments explaining the effect of certain voltage changes in the circuit of FIG. 3.

It should be noted that all of the changes shown in FIG. 6 during a positive-going transition of $\phi_1$ occur in the time period $t_1$-$t_2$ of FIG. 4.

Consider now the specific operation of the circuit during the time period $t_1$-$t_2$. The level of terminal 43 of FIG. 3 goes high at time $t_1$ which causes the output of Exclusive OR gate 42 to also go high thereby causing the bi-directional counter 50 to count up on count since the direction determining signal $e_{45}$ is at its high level at time $t_1$ as shown in waveform D of FIG. 4.

The direction in which the bi-directional counter 50 will count is determined by the polarity level of voltage on the direction control input lead 45 of FIG. 3 which, in turn, is controlled by the level of the two voltages supplied to the two input leads of Exclusive OR gate 40. By arbitrary definition the counter 50 is said to count up when the voltage level $e_{45}$ on the direction control input terminal 45 is high which requires that the voltage levels supplied to the two inputs of Exclusive OR gate 40 be different. At time $t_1$ in FIG. 4 the level of $\phi_2$ is high and the level of the Q output lead 44 of flip-flop 52 is low since the clock pulse has not yet been supplied the clock input lead 53 of flip-flop 52 after the transition of $\phi_1$ from low to high at time $t_1$.

The level transition of $\phi_1$ is also supplied through logic means 55 and then in parallel paths to the two input terminals of Exclusive OR gate 59, with one path being a direct connection to one input terminal of Exclusive OR gate 59 and the other path comprising a second delay means consisting of resistor 58 and capacitor 57. This results in different levels being supplied to the two input terminals of Exclusive OR gate 59 for a short interval of time which in turn results in a positive-going clock pulse being generated by Exclusive OR gate 59 and supplied to the input 53 of flip-flop 52. Such clock pulse causes the voltage level of the Q output 44 of flip-flop 52 to become equal to the voltage level of the D input 51 which, as discussed above, is a high level signal.

The voltage levels on the two input leads 43 and 44 of Exclusive OR gate 42 now become equal to cause the direction determining voltage on lead 45 of FIG. 3 to go to its low level as indicated by the negative-going trailing edge 63 of the direction determining signal $e_{45}$, shown in waveform D of FIG. 4.

At time $t_3$, $\phi_2$ changes from its high to its low level to cause the direction determining signal $e_{45}$ on lead 45 to change to its high level since the voltage levels supplied to the two inputs of Exclusive OR gate 40 are now again different. Portion B of the chart of FIG. 6 shows the polarity changes occurring in the circuit of FIG. 3 of times $t_5$-$t_6$ when $\phi_1$ changes from its high to its low level.

The high level state of the direction determining signal $e_{45}$, shown in waveform D of FIG. 4, is the proper direction indicating level required for the next transition of $\phi_1$ which occurs at time $t_5$ and is a high-to-low level transition. At time $t_5$, a clock pulse is generated on the output terminal 46 of Exclusive OR gate 42 to increment the bi-directional counter 50 in the proper direction indicated by the high level signal outputted from the Exclusive OR gate 40 at time $t_5$.

Then at time $t_6$ a clock pulse is supplied from delay means 55 to clock input terminal 53 of flip-flop 52, thereby causing the Q output 44 of flip-flop 52 to assume the same level as the D input 51 thereof which is a low level state as can be seen from waveform A of FIG. 4 at time $t_6$.

The change of the Q output 44 of flip-flop 52 from its high-to-low level results in the two inputs of Exclusive OR gate 40 both having low signal levels supplied thereto which will result in a low level output signal on output terminal 45 thereof. Such low level output signal from Exclusive OR gate 40 at time $t_6$ is not the proper level required to indicate the actual direction of rotation of the disc 10 of FIG. 1 when the next transition of $\phi_1$ occurs at $t_9$. To correct such improper level of the direction determining signal $e_{45}$, the input signal $\phi_2$ changes from its low to its high level at time $t_8$. This causes the signal levels on the two inputs of Exclusive OR gate 40 to be unequal, and thereby produce a high level signal on the output terminal 45 thereof, which is the correct level for indicating the counterclockwise direction of rotation of disc 10 of FIG. 1, i.e. the condition where the phase of $\phi_2$ leads the phase of $\phi_1$.

Then at time $t_9$, the level of $\phi_1$ changes from its low to its high level to produce another clock pulse on the output terminal 46 of Exclusive OR gate 42 which causes the counter 50 to be incremented in the proper direction in accordance with the low level output signal $e_{45}$ of Exclusive OR gate 40.

Referring now to the waveforms of FIG. 5, the operation of the circuit of FIG. 3 will be discussed when the rotation of the disc 10 of FIG. 1 is counterclockwise, i.e. when the phase of $\phi_1$ leads the phase of $\phi_2$ rather than lagging the phase of $\phi_2$.

Assume the initial conditions as shown at time $t_0$ in the waveforms of FIG. 5 wherein $\phi_1$ and $\phi_2$ are both at their low levels. The Q output 44 of flip-flop 52 is also assumed to be at its low level since $\phi_1$ is at its low level and a previous clock pulse has been supplied to the clock input 53 of flip-flop 52. Consequently, since both inputs to Exclusive OR gate 40 are at a low level, the output $e_{45}$ thereof will also be at a low level. Further, since both inputs to Exclusive OR gate 42 are at a low level, the output $e_{45}$ thereof will be at a low level. Accordingly, when $\phi_1$ goes from its low to its high level at time $t_1$, the voltage levels on the two inputs of Exclusive OR gate 42 become different and the output $e_{46}$ thereof changes from a low to a high level to cause counter 50 to change its count by one. Since the direction control input $e_{45}$ is at its low level at time $t_1$, the counter 50 will count down.

A short time later, at time $t_2$, the positive-going transition of $\phi_1$ will have passed through delay 55 and Exclusive OR gate 59 to provide a positive-going clock pulse $e_{45}$ to the clock input 53 of flip-flop 52, thereby causing the Q output signal level thereof to become equal to the signal level of the D input 51 thereof. In other words, $e_{44}$ becomes equal to $e_{51}$. Therefore, the signal levels on the two inputs to Exclusive OR gate 42 will again become equal at time t₂ so that the output e₄₆ thereof will return to its low level. Then, at time t₃, φ₂ goes from its low to its high level so that the signals supplied to the two inputs of Exclusive OR gate 40 are again equal although they are both now high rather than low. Thus, the output e₄₅ of Exclusive OR gate 40 will go from its high level to its low level at time t₃ to condition bi-directional counter 50 to count down at the next transition of φ₁ which occurs at time t₄. When φ₁ changes levels at time t₄, the two inputs of Exclusive OR gate 42 will have signals of different levels supplied thereto to produce a positive-going clock pulse on the output terminal 46 of Exclusive OR gate 42, thereby causing the bi-directional counter 50 to decrement its count by one.

Next, at time t₆, φ₂ goes to its low level so that the two inputs to Exclusive OR gate 40 are both at a low level, thereby producing a low level signal on the output terminal 45 thereof. At time t₆, the same conditions exist as existed at time t₀ in FIG. 5 and the cycle of operation is complete and will repeat with subsequent level transitions of φ₁.

The above discussion of the waveforms of FIGS. 4 and 5 illustrate the operation of the circuit of FIG. 3 when the phase of φ₁ lags that of φ₂ and when the phase of φ₁ leads that of φ₂. It will now be shown why no counts are lost should the disc being monitored oscillate back and forth across a level transition of φ₁. To illustrate the foregoing reference is again made to the waveforms of FIG. 4 and specifically to the time interval t₄-t₆ of FIG. 4.

Assume that the phase transition 66 of φ₁ has occurred at time t₅ and has produced an incremental up count in bi-directional counter 50 and further has caused a clock pulse to be supplied through pulse generating circuit 55 to input 53 of flip-flop 52 to cause the voltage level of the Q output 44 thereof to equal the voltage level of the D input 51. The foregoing occurs at time t₆ and results in the output of Exclusive OR gate 40 having a low level signal e₄₅ at time t₆ since the signal levels to both inputs of Exclusive OR gate 40 are at their low levels.

Assume that, at time t₇, the disc 10 (FIG. 1) suddenly reverses its directions (to a clockwise direction) so as to, in effect, go back in time through time t₅ where the transition of φ₁ will again occur. However, this transition of φ₁ will appear as a positive-going transition rather than a negative-going transition since the direction of the disc 10 is reversed and the light source which generates φ₁ is appearing at the edge of an aperture rather than disappearing behind the edge of an aperture.

Since, at time t₅, when the disc 10 (FIG. 1) is going in the reverse direction, the direction determining signal e₄₅ will now be at its low level so that count of bi-directional counter 50 will be decremented rather than incremented Then at time t₄, which is now a later time since the disc 10 of FIG. 1 is going in the reverse direction, a clock pulse is generated by pulse generating means 55 as a result of the positive-going transition of φ₁ at time t₅. Such clock pulse is supplied to the clock input 53 of flip-flop 52, thereby causing the signal level of Q output terminal 44 to become equal to the signal level on D input terminal 51.

Should the disc again reverse its direction to again rotate in the counter-clockwise direction, it will again cross the level transition of φ₁ at time t₅. Such a level transition again appears as a negative transition of φ₁. Such negative-going level transition will cause bi-directional counter 50 to increment by a count of one since the direction control signal e₄₅ is now at a high level.

Thus, it can be seen that each time a transition level of φ₁ occurs, the bi-directional counter 50 will either be incremented or decremented by a count of one depending on which direction the disc 10 (FIG. 1) is rotating since the resulting change in the direction control signal e₄₅ always lags the occurrence of the level transition of φ₁ regardless of the direction of rotation of the disc. The sequence of voltage changes occurring between times t₆ and t₄ in FIG. 4 when the disc reverses its direction is shown in portion C of the chart of FIG. 6.

Figure 7:
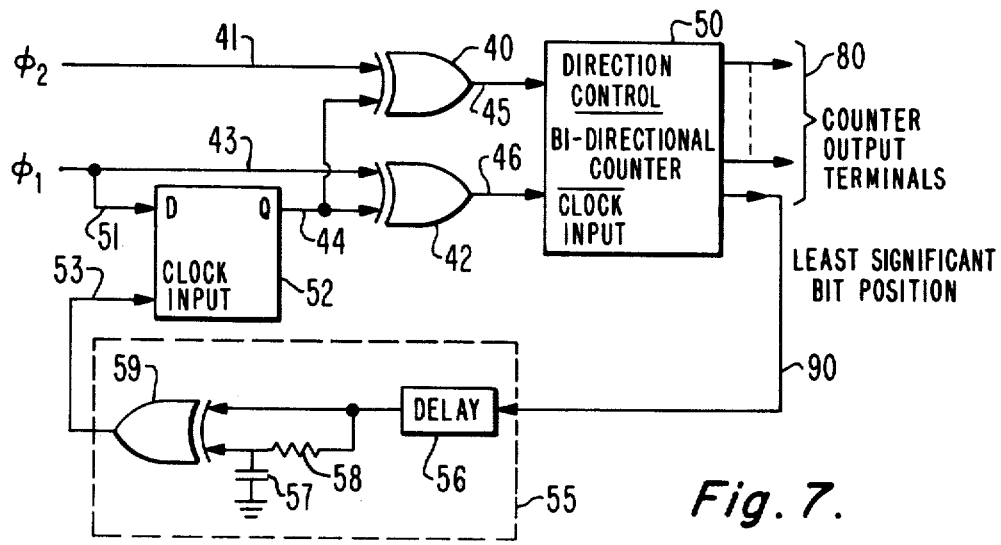
FIG. 7 is a combined block and logic diagram of another form of the invention.

Referring now to FIG. 7 there is shown another embodiment of the invention. More particularly, in FIG. 7 the logic within dotted block 55 is identical to that within block 55 of FIG. 3 and performs the same clocking function for flip-flop 52 in that it delays the pulse produced by a change in signal level of either polarity. Specifically, logic 55 in FIG. 7 responds to a level change of either polarity of the least significant bit position of bi-directional counter 50 to generate a delayed pulse of positive polarity. Such delayed pulse is supplied back to the clock input terminal 53 of flip-flop 52 to cause the Q output terminal 44 thereof to assume the same logic level as the D input terminal 51.

Figure 8:
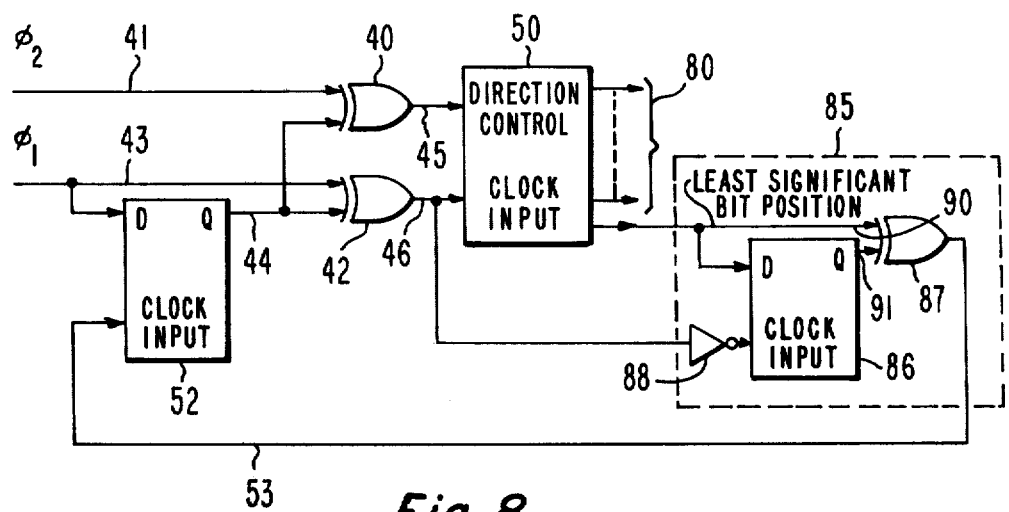
FIG. 8 is a combined block and logic diagram of still another form of the invention.

Referring now to FIG. 8 there is shown still another embodiment of the invention wherein the necessary delayed pulse supplied to the clock input 53 of flip-flop 52 is produced by the logic within dotted block 85.

More specifically, after a level transition of φ₁, the counter 50 decrements or increments by a count of one in accordance with the level of e₄₅. The output appearing on the least significant bit position of counter 50 will also change its level at each count so that the signal level of the D input of flip-flop 86 will also change and become unequal to the signal level on the Q output terminal 91. Therefore, the output of Exclusive OR gate 87 will go to its high level to provide a clock pulse to the clock input 53 of flip-flop 52. Thus, the Q and D terminals of flip-flop 52 will become equal so that the output of Exclusive OR gate 46 will go to its low level.

The high-to-low transition of the output of the Exclusive OR gate 42 is inverted by inverter 88 to provide a positive-going transition to the clock input of flip-flop 86. The signal level on the Q terminal 91 of flip-flop 86 thereby becomes equal to that of the D input terminal causing the signal levels supplied to the two input terminals of Exclusive OR gate 87 to become equal and the output thereof to go to its low value. The system is now ready to receive and process another level transition, either positive or negative, of the input signal φ₁.

What is claimed is:

1. A circuit for detecting each level transition of a first two level signal of a given frequency and its leading or lagging phase relationship with a second two level signal of said given frequency at the time of each level transition of said first signal, said circuit comprising:

signal level storage means having a first data input terminal for receiving said first signal, a first output terminal, and a first clock pulse input terminal, and constructed to store a signal level supplied to its data input terminal and to transfer said stored signal level to its output terminal when a clock pulse is supplied to its clock pulse input terminal;

first and second voltage comparator means each having a first input terminal for receiving said first and second signals, respectively, a second input terminal connected to said first output terminal, and a second output terminal, and each responsive to equal or non-equal signal levels supplied to its first and second input terminals to produce first and second output signal levels, respectively;

first means responsive to the output signal levels of said first and second voltage comparator means to determine the leading or lagging phase relationship of said first and second signals at each level transition of said first signal; and second means for supplying a clock pulse to said first clock pulse input terminal a predetermined time after the occurrence of each level transition of said first signal.

2. A circuit as in claim 1 in which:

said first means comprises a bi-directional counting means having a least significant digit position; and in which said second means connects the least significant digit position of said bi-directional counting means to said first clock pulse input terminal and comprises the series arrangement of:

means for converting each level transition of said first input signal to a pulse of a given polarity; and pulse delay means.

3. A circuit as in claim 1 in which said second means connects said first two level input signal to said first clock pulse input terminal and comprises means for converting each level transition of said first input signal into a delayed pulse of a given polarity.

4. A circuit as in claim 1 in which said second means connects the output terminal of said first voltage comparator means to said first clock pulse input terminal and comprises means for converting each level transition of said first input signal into a delayed pulse of a given polarity.

5. A circuit as in claim 1 in which:

said first means comprises a bi-directional counting means having a least significant bit position; and in which said second means comprises:

INVERTER means having an input terminal connected to the output terminal of said first voltage comparator means and having an output terminal;

a second signal level storage means having a second data input terminal connected to the least significant bit position of said bi-directional counting means, a third output terminal, and a second clock pulse input terminal connected to the output terminal of said INVERTER means;

third voltage comparator means having a pair of input terminal means connected respectively to said least significant bit position of said bi-directional counting means and the output terminal of said second signal level storage means, respectively; and means for connecting the output terminal of said third voltage comparator means to the clock input terminal of said first signal level storage means.

6. A circuit for detecting and recording each level transition of a first two level signal of a given frequency and its leading or lagging phase relationship with the phase of a second two level signal of said given frequency at the time of each level transition of said first signal, said circuit comprising:

first signal level storage means having a first data input terminal for receiving said first signal, a first output terminal and a first clock input terminal and constructed to store a signal level supplied to its input data terminal and to transfer said stored signal level to its output terminal when a clock signal is supplied to its clock input terminal;

bi-directional counter means having a count direction determining terminal and a second clock input terminal;

first and second Exclusive OR gate means each having a first input terminal for receiving respectively said first and second two level signals, a second input terminal connected to said first output terminal, and each having an output means connected respectively to said second clock input terminal and to said count direction determining terminal; and first means for supplying a clock pulse to said first clock input terminal a predetermined time interval after the occurrence of each level transition of said first two level signal.

7. A circuit as in claim 6 in which:

said bi-directional counter means further comprises a least significant digit position; and in which said first means connects the least significant digit position of said bi-directional counter to said first clock input terminal and comprises means for converting each level transition of the contents of said least significant digit position into a delayed pulse of a given polarity.

8. A circuit as in claim 6 in which said first means connects said first two level signal to said first clock input terminal and comprises means for converting each level transition of said two-level signal into a delayed pulse of a given polarity.

9. A circuit as in claim 6 in which said first means connects the first output means of said Exclusive OR gate means to said first clock input terminal and comprises means for converting each level transition of the output signal of said Exclusive OR gate means into a delayed pulse of a given polarity.

10. A bi-directional digital position indicator as in claim 6 in which said first means comprises:

INVERTER means having an input terminal connected to the output terminal of said first Exclusive OR gate means and having a second output terminal;

a second signal level storage means having a third input terminal connected to the least significant bit position of said bi-directional counting means, a third output terminal, and a third clock input terminal connected to the output terminal of said INVERTER means;

third Exclusive OR gate means having an output terminal and a pair of fourth input terminals which are connected respectively to said least significant bit position of said bi-directional counting means and the output terminal of said second signal level storage means; and means for connecting the output terminal of said third Exclusive OR gate means to the clock input terminal of said first signal level storage means.

* * * * *